(12) United States Patent
Denham

(10) Patent No.: US 8,519,879 B1
(45) Date of Patent: Aug. 27, 2013

(54) PRECISION CHARGE-DUMP CIRCUIT

(75) Inventor: Martin S. Denham, Bend, OR (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/446,495

(22) Filed: Apr. 13, 2012

(51) Int. Cl.
*H03M 1/12* (2006.01)

(52) U.S. Cl.
USPC ........... 341/155; 327/536; 327/382; 327/261; 327/337; 327/530; 324/116; 324/142; 375/249; 341/140; 341/136; 341/139

(58) Field of Classification Search
USPC ............... 341/14–155; 327/94, 337, 536, 327/530, 261, 382, 514; 375/249; 324/116, 324/142
See application file for complete search history.

(56) References Cited

U.S. PATENT DOCUMENTS

| | | | | |
|---|---|---|---|---|
| 3,969,634 A | * | 7/1976 | Su et al. | 377/57 |
| 4,761,606 A | * | 8/1988 | Germer et al. | 324/142 |
| 5,972,076 A | * | 10/1999 | Nichols et al. | 95/81 |
| 6,091,531 A | * | 7/2000 | Schwartz et al. | 398/208 |
| 6,169,444 B1 | * | 1/2001 | Thurber, Jr. | 327/536 |
| 6,492,830 B1 | * | 12/2002 | Ju et al. | 324/762.09 |
| 6,512,411 B2 | * | 1/2003 | Meng et al. | 327/536 |
| 6,781,434 B2 | * | 8/2004 | Jensen et al. | 327/382 |
| 8,009,077 B1 | * | 8/2011 | Melanson | 341/155 |
| 8,098,316 B2 | * | 1/2012 | Parks | 348/311 |
| 8,102,455 B2 | * | 1/2012 | Parks | 348/311 |

* cited by examiner

*Primary Examiner* — Lam T Mai
(74) *Attorney, Agent, or Firm* — Lando & Anastasi, LLP

(57) ABSTRACT

A precision charge dump circuit configured to transfer preset quanta of charge to or from a first capacitor (for example, an integration capacitor in an in-pixel ADC circuit). In one example, the charge dump circuit uses a second capacitor that is pre-charged with the preset quanta of charge to determine the preset value of the quanta of charge, and an amplifier in a voltage-follower mode to cause the charge subtraction or addition.

18 Claims, 9 Drawing Sheets

PRECISION CHARGE-DUMP CIRCUIT

BACKGROUND

In legacy analog imagers, particularly infrared imagers, photo-current from a detector diode is integrated by a well capacitor coupled to the detector diode, and then once per video frame, the voltage or charge of each well capacitor is transferred to a down-stream analog-to-digital converter (ADC), where the voltage is converted to a binary value. Pixel sizes continue to shrink and the ratio of well capacitor to pixel area shrinks disproportionately more. Simultaneously, there is a demand by consumers for increased Signal-to-Noise Ratio (SNR) which can be realized by increasing effective well capacitance.

In-pixel ADC imagers are used to address this problem associated with decreasing pixel size. In particular, in-pixel ADC imaging improves photo-charge capacity for infrared imaging and other applications as the size of pixels continues to decrease. A good in-pixel ADC design can store nearly all of the available photo-charge from a detector diode and thus improve SNR to near theoretical limits. A common method of integration for in-pixel ADC circuits uses a quantizing analog front end circuit which accumulates charge over a relatively small capacitor, trips a threshold and is then reset. This pattern is repeated as more photo-current integrates.

An example of an in-pixel ADC circuit 100 is illustrated in FIG. 1A. Charge from a photo-diode 110 is accumulated over an integration capacitor 115. When a threshold voltage (Vth) set by a comparator 120 and threshold voltage source 125 is reached, the circuit is reset via a reset switch 130, as discussed above. Each reset event is accumulated (counted) with a digital counter circuit 135. At each frame, a "snapshot" of the contents of the digital counter 135 is copied into a register or memory and read out, line by line. This circuit 100 operates to exponentially increase the well capacity $Q_{INT}$ of the integration capacitor 115 by a factor of $2^n$, where n is the size of the digital counter 135. Thus, by conserving the available photo-charge within a frame period, this type of read-out integrated circuit 100 may achieve improved signal-to-noise ratio.

The example in-pixel ADC circuit 100 illustrated in FIG. 1A is an asynchronous circuit. In asynchronous in-pixel ADCs, the comparator reset event occurs as soon as the voltage on the integrating capacitor 115 crosses the comparator threshold. FIG. 1B is a waveform diagram illustrating the voltages in FIG. 1A. As can be seen with reference to FIGS. 1A and 1B, during each reset event, the integration capacitor 115 is not integrating photo-current from the photodiode 110. The short durations when reset events are occurring are inconsequential at low photo-current levels, but become an important limiter of accuracy as photo-current nears maximum levels for a given application or configuration. Thus, the duration of the reset event can contribute to a loss of accuracy of the ADC function.

In-pixel ADC circuits that use synchronous sampling include a periodic clock that causes the value of voltage across the integration capacitor 115 to be compared at discrete intervals. However, if the integration capacitor 115 is simply reset to a voltage, such as a supply voltage level, errors may occur due to the loss of any charge associated with voltage in excess of the comparator threshold on the integration capacitor.

SUMMARY OF INVENTION

Aspects and embodiments are directed to a precision charge pump circuit which may have broad usefulness, and in particular, may provide significant improvements to an in-pixel ADC circuit such as those used for focal plane arrays. Although there have been other devices that feature precision charge dump circuits, there are complexities associated with the circuits, such as large circuit area consumption, the inability to use certain components of the circuit (for example, an operational amplifier) for other purposes, significant noise terms associated with a dump capacitor waste supply line, and complexity. In contrast, according to certain embodiments, a simple precision charge dump circuit is provided which may operate to remove discrete quanta of charge from an integrating capacitor, and improve accuracy of an in-pixel ADC, as discussed in more detail below. Unlike conventional in-pixel ADC circuits, embodiments of the precision charge dump do not cause a charge dump event to block photo-current integration. According to certain examples, the precision charge dump circuit may remove quanta of charge from the integration capacitor, instead of resetting it to a voltage. Thus, any charge (or voltage) over the comparison threshold may be conserved. Charge conservation of photo-current may further contribute to reducing error and perceived noise. Furthermore, since in certain embodiments the charge dump circuit does not block integration, inaccuracies from reset events may be diminished. Furthermore, this feature of integration not being blocked during the charge dump operation may provide a significant advantage in that it allows the duration of time of the charge subtraction to be extended, leading to reduction in circuit power. In addition, embodiments of the precision charge dump circuit may be extended in such a way so as to allow circuit components (such as an operational amplifier) to perform other tasks of an In-Pixel ADC network, thereby providing power saving benefits. These and other features and advantages of embodiments of the precision charge dump circuit are discussed in more detail below.

According to one embodiment, a precision charge dump circuit comprises an amplifier having a first input, a second input, and an output, and configured in a voltage-follower configuration with the output coupled to the first input, a first capacitor coupled to the second input terminal of the amplifier, a second capacitor coupled between first and second voltage references by a first pair of switches operable to selectively allow the second capacitor to be charged with a predetermined quantum of charge from the first voltage reference, the second capacitor being connected between the first pair of switches, and a second pair of switches including a first switch connected between the first capacitor and a first terminal of the second capacitor, and a second switch connected between an output of the amplifier and a second terminal of the second capacitor, the second pair of switches operable to selectively transfer the predetermined quantum of charge to or from the first capacitor.

In one example, the first capacitor is an integration capacitor coupled to a photo-detector and configured to integrate photo-current from the photo-detector. In one example, the first terminal of the second capacitor is a negative terminal, the second terminal of the second capacitor is a positive terminal, and the second pair of switches is operable to selectively subtract the predetermined quantum of charge from the first capacitor. In another example, the first terminal of the second capacitor is a positive terminal, the second terminal of the second capacitor is a negative terminal, and the second pair of switches is operable to selectively add the predetermined quantum of charge to the first capacitor. The first pair of switches and the second pair of switches may be configured such that the switches of the second pair of switches are not closed at the same time that the switches of first pair of switches are closed. In one example, the amplifier is an operational amplifier. The operational amplifier may be configured to perform a compare operation, and the precision charge dump circuit may further comprise a third pair of switches configured to selectively interrupt the voltage follow configuration of the operational amplifier and couple a third voltage reference to the first terminal of the operational amplifier. In another example, the precision charge dump circuit further comprises a latch coupled to the output of the operational amplifier. In another example, the first terminal of the second capacitor is coupled to a first terminal of the first capacitor, the operational amplifier is configured to perform a sample-and-hold operation, and the precision charge dump circuit further comprises a third capacitor having a first terminal coupled to the second terminal of the first capacitor, and an additional switch connected between the output of the operational amplifier and a second terminal of the third capacitor and operable to selectively connect the output of the operational amplifier to the second terminal of the third capacitor. The first and second pairs of switches may include FET switches, for example.

According to another embodiment, a method of subtracting predetermined quanta of charge from a source capacitor comprises pre-charging a programming capacitor with a predetermined quantum of charge, and subsequently subtracting the predetermined quantum of charge from the source capacitor by coupling the programming capacitor between the source capacitor and an output of an amplifier configured in a voltage follower configuration.

In one example of the method, pre-charging the programming capacitor includes connecting the programming capacitor between a pair of voltage references. In another example, connecting the programming capacitor between a pair of voltage references includes closing a first switch to connect a first terminal of the programming capacitor to a first voltage reference of the pair, and closing a second switch to connect a second terminal of the programming capacitor to a second voltage reference of the pair. Coupling the programming capacitor between the source capacitor and the output of an amplifier may include opening the first and second switches, and closing a third switch to connect the first terminal of the programming capacitor to the output of the amplifier, and closing a fourth switch to connect the second terminal of the programming capacitor to the source capacitor. In one example, the method further comprises integrating photo-current from a photo-detector with the source capacitor simultaneously with the subtracting of the predetermined quantum of charge from the source capacitor. The amplifier may be an operational amplifier, for example. In one example, method further comprises performing a compare operation using the amplifier by selectively coupling a voltage reference to an input terminal of the operational amplifier. In another example, the method further comprises performing a sample-and-hold operation with the operational amplifier by selectively coupling a third capacitor between a voltage reference and the output of the operational amplifier.

According to another embodiment, a method of adding predetermined quanta of charge to a first capacitor comprises pre-charging a second capacitor with a predetermined quantum of charge, and subsequently adding the predetermined quantum of charge to the second capacitor by coupling the second capacitor between the first capacitor and an output of an amplifier configured in a voltage follower configuration.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1A:
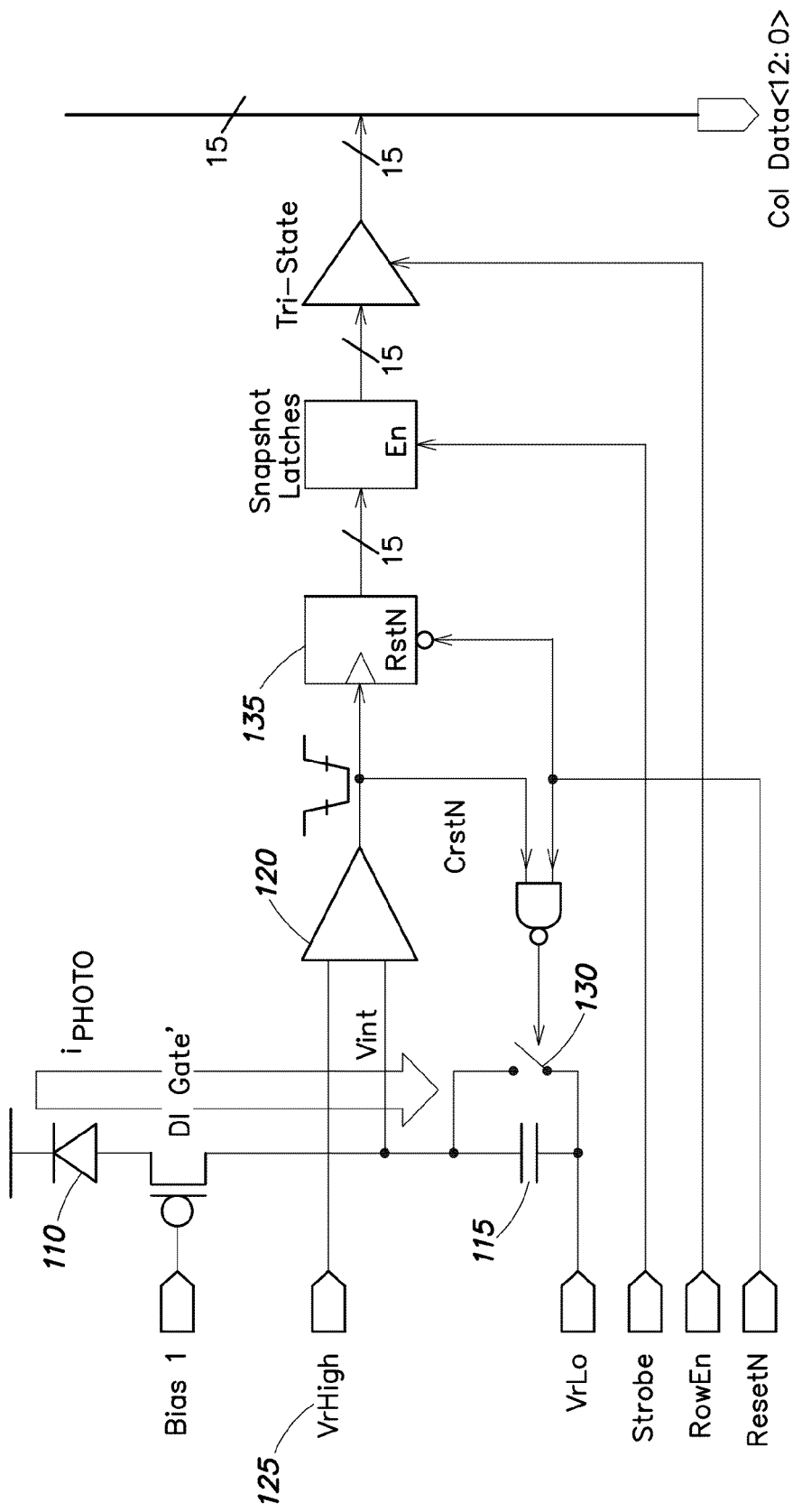
FIG. 1A is a diagram of one example of a conventional in-pixel ADC circuit.
Figure 1B:
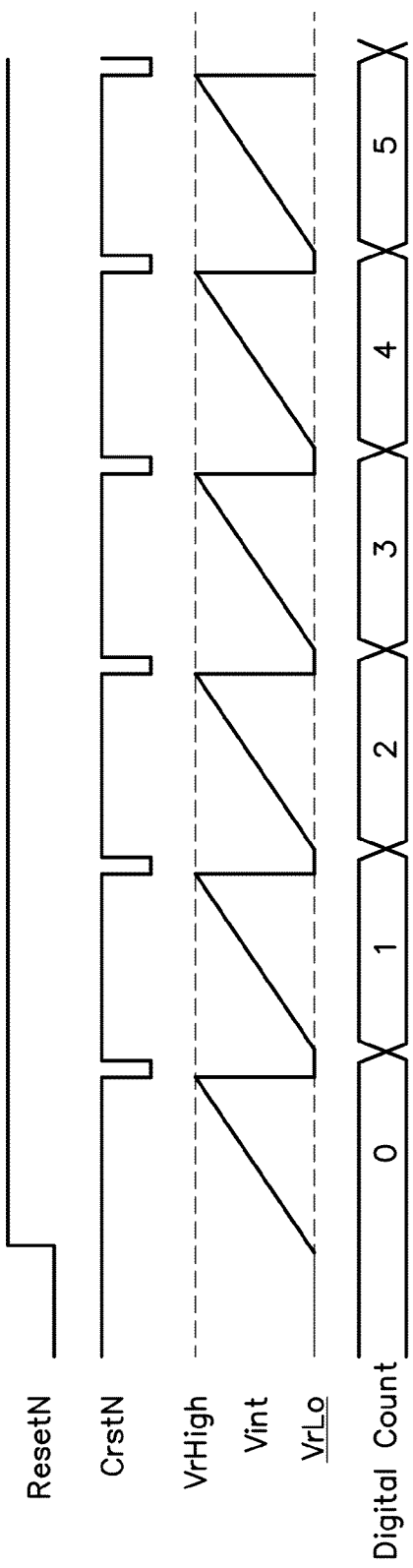
FIG. 1B is a graph illustrating voltage levels corresponding to operation of the in-pixel ADC circuit of FIG. 1A.

Aspects and embodiments relate generally to circuit design, and in some examples, more particularly CMOS circuit design in the area of integrated circuit (IC) design, such as read-out integrated circuits (ROICs) for imagers. Certain embodiments are directed to a precision charge dump circuit which may add or remove discrete quanta of charge to/from an integrating capacitor. In one example, such a precision charge dump circuit may provide improvements in accuracy of in-pixel ADC circuits, particularly when such circuits are synchronously sampled, as discussed in more detail below.

As discussed above, in-pixel ADC imagers use binary counters to count "buckets" or quanta of photo-current in a video frame. An integration capacitor accumulates charge until it crosses a voltage threshold, at which point a binary digital counter is incremented and the capacitor is reset. As discussed above, conventional in-pixel ADC circuits suffer from several disadvantages. In particular, the resetting of the integration capacitor consumes a finite amount of time, during which the integration capacitor does not integrate photo-current. In addition, a synchronously sampled in-pixel ADC circuit may also have an error term for any excess charge on the integration capacitor (if capacitor reset used). Although there are numerous in-pixel ADC circuit implementations, some of which use a charge dump circuit to transfer charge from the integration capacitor to a previously discharged "dump" capacitor, these circuits all suffer the same reset problem of not integrating photo-current during the reset (or charge subtraction) event.

According to certain embodiments, a charge dump circuit is provided which is capable of subtracting or adding usefully precise quanta of charge from/to a first source capacitor. In the context of an in-pixel ADC circuit, this first capacitor is the integrating capacitor of a unit cell. The charge dump circuit includes a second programming (or "quanta") capacitor (for programming the quanta of charge to be subtracted or added, as discussed in more detail below) and one or more sets of programming switches. In one example, the programming capacitor is connected to a reference voltage source and is used to determine the amount of charge to be subtracted (or added) to the first capacitor. The programming switches may be implemented as FET switches that are used to enable (or turn on) the programming event, as discussed further below. It will be appreciated by those skilled in the art, given the benefit of this disclosure, that the sign of the charge dump (positive or negative, relative to absolute ground), is not important; the circuit may perform either or both, depending on the switch (e.g., FET) configuration and timing. The charge dump circuit also includes an amplifier, such as an operational amplifier, and control switches for causing the programmed quanta of charge to be removed from the first capacitor, as discussed in more detail below. In one example, the control switches are also implemented as a set of FET switches, and are configured to switch the programming capacitor into a desired configuration with the operational amplifier (e.g., a configuration resembling a voltage follower) which then causes the programmed charge to be subtracted from the first capacitor, as discussed further below.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 2A:
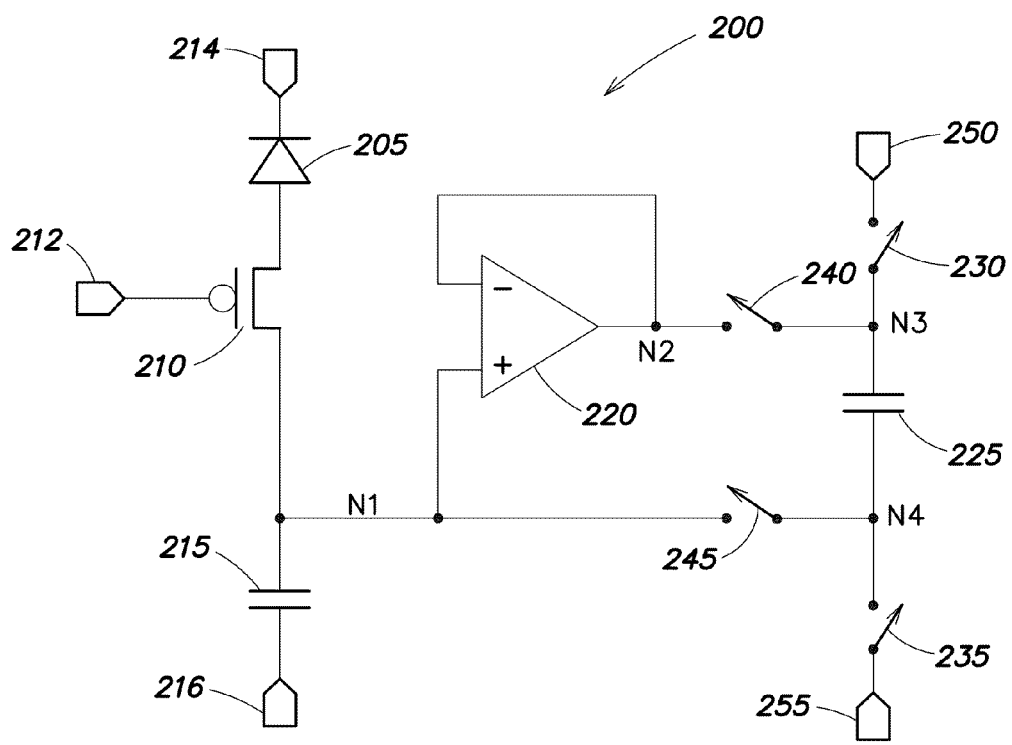
FIG. 2A is a diagram of one example of a precision charge dump circuit according to aspects of the invention.

Referring to FIG. 2A, there is illustrated a diagram of one example of a precision charge dump circuit 200 according to one embodiment. In the illustrated example, a detector diode 205 is coupled to a direct injection (DI) gate transistor 210, in this example a PFET. A gate voltage is applied to the gate transistor 210 via terminal 212. The other terminal of the detector diode 205 is coupled to a terminal 214 to which a detector reference voltage (Vdet) is applied. It will be appreciated by those skilled in the art of imager circuit design, given the benefit of this disclosure, that other connection topologies for connecting the detector diode 205 may be implemented. Thus, the detector diode 205 delivers photo-current to node N1 of an integrating circuit. Node N1 is also connected to an integrating capacitor 215 which accumulates charge, thus integrating the photo-current to produce a voltage. The other terminal of the integrating capacitor 215 is coupled to a low voltage reference level 216. Node N1 is further connected to a first input of an operational amplifier 220. The opposite (second) input of the operational amplifier 220 is connected to the output (at node N2) of the operational amplifier, creating a voltage follower configuration.

Figure 2B:
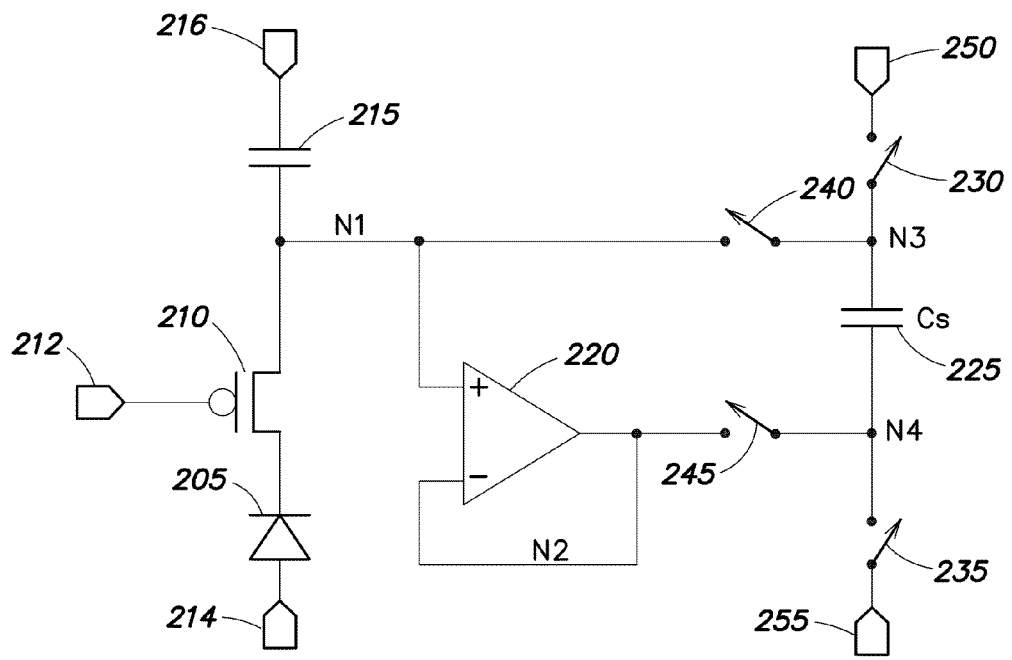
FIG. 2B is a diagram of another example of the precision charge dump circuit according to aspects of the invention.

In the example illustrated in FIG. 2A, the node N1 is connected to the positive input terminal of the operational amplifier 220 and the output of the operational amplifier connected to its negative input terminal. However, as will be appreciated by those skilled in the art, given the benefit of this disclosure, the circuit may be implemented with the operational amplifier input terminals connected in reverse of the configuration illustrated in FIG. 2A to create a precision charge addition, as shown in FIG. 2B. An arrangement such as that illustrated in FIG. 2B may be used in an imager in the situation where the detector 205 requires a different bias scheme, for example. In another implementation, FET switches may be used to alternately effect either mode of operation (subtraction or addition).

Referring to FIGS. 2A and 2B, a quanta capacitor 225 is coupled into the circuit with four switches, 230, 235, 240, and 245. The switches 230, 235, 240, and 245 may be of an appropriate MOSFET type (PFET or NFET) and there is flexibility in the choice of MOSFET types. In one embodiment, switches 230 and 235 operate as a pair and switches 240 and 245 also operate as a pair. The control and timing of these switches has flexibility; however, in one embodiment, switch pair 230 and 235 cannot be closed at the same time as switch pair 240 and 245, since any such overlap may introduce error in the charge subtraction, as discussed further below.

The operational amplifier 220 may be implemented using any of several different amplifier topologies. The terms operational amplifier and differential amplifier may be used interchangeably throughout this disclosure. The amplifier 220 has a differential input voltage (Vdiff) and produces at least an output voltage that is $(\beta)*(Vdiff)$, where $\beta$ is the gain of the amplifier. For in-pixel ADCs, or other imaging applications, it is preferable that the amplifier 220 have a very high input impedance, which is inherent to CMOS. However, for other applications where amplifier input leakage is inconsequential, the circuit topology may be applied to other technologies (such as bipolar).

According to one embodiment, the circuit 200 operates in phases, and there may be at least three phases. Phase 1 is the charge filling phase, Phase 2 is a charge subtraction phase, and Phase 3 is an inert or open phase during which all of the switches 230, 235, 240 and 245 are open. In one embodiment, Phase 1 and Phase 2 are always separated by a Phase 3. In addition, in some examples, Phase 1 is usually a relatively long phase that accompanies charge integration and Phase 2 is usually a relatively short phase, lasting only long enough to fully deplete the charge from the quanta capacitor 225. However, in some embodiments, the ability of the circuit to simultaneously integrate and subtract leads to an advantage where Phase 2 can be extended to a relatively long time period. Since embodiments of the circuit simultaneously integrate and subtract charge, the circuit is inherently charge conserving, and there is no penalty for the extended subtraction time. Such an embodiment allows a lower power, lower bandwidth operational amplifier to be used, leading to significant power reduction.

Figure 3:
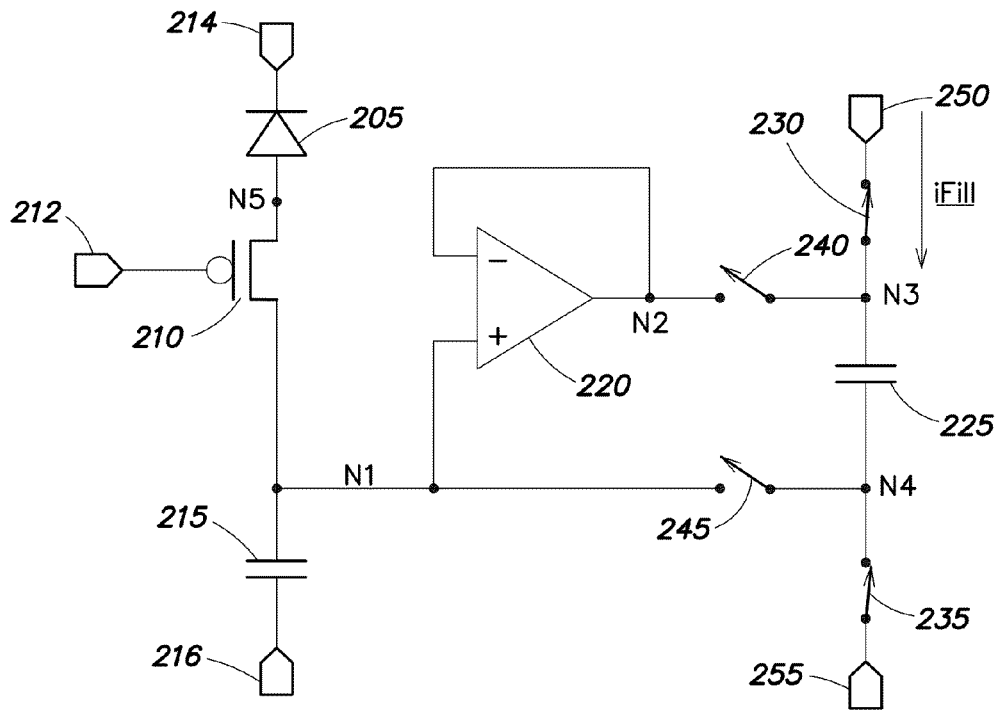
FIG. 3 is a diagram of one example of a precision charge dump circuit in a charge filling phase during which quanta of charge are loaded on the programming capacitor, according to aspects of the invention.

FIG. 3 illustrates an example of the charge filling phase, Phase 1, in which quanta of charge are loaded on to the quanta capacitor 225. Switches 230 and 235 are closed to allow a positive voltage reference 250 (vpRef) to be connected to the upper terminal of the quanta capacitor 225 (also node N3) and a negative voltage reference 255 (vnRef) to be connected to the lower terminal of the quanta capacitor 225 (also node N4). Thus the quanta capacitor 225 becomes positively charged with the upper terminal (N3) more positive than the lower terminal (N4). A charging current, Ifill, flows from the positive voltage reference 250 via node N3 to charge the quanta capacitor 225. The amount of charge stored on the quanta capacitor 225 is given by: (vpRef−vnRef)*Cs, where Cs is the capacitance of the quanta capacitor, and can be referred to as a quantum of charge, Qs. The use of the quanta capacitor 225 in the circuit 200 is a significant and counter-intuitive departure from conventional in-pixel ADC circuits. Conventionally, the focus of precision charge subtraction has been on moving quanta of charge from the integration capacitor 215 to an empty dump capacitor. In contrast, according to one embodiment, the quanta capacitor 225 is pre-charged from a reference voltage pair (250, 255) to the level of charge that is desired to be subtracted, and its terminals are then effectively reversed to create the charge subtraction operation. In one example, the "pre-filling" of the quanta capacitor 225 draws a mirror current from the supply terminals that minors the received photo-current (when considered over a long time interval, such as a frame period). The photo-current typically may be negligible, and therefore this minor current may not have a significant impact of the power requirements of the circuit. This method of pre-charging the quanta capacitor may provide another advantage, namely that the size of the quanta capacitor can be relatively small and the (vpRef−vnRef) term may be large (relative to the quantized voltage step to be produced on the integration capacitor). This leads to area savings in the pixel. Also, having a relatively large (vpRef−vnRef) may lead to accuracy improvement.

Figure 4:
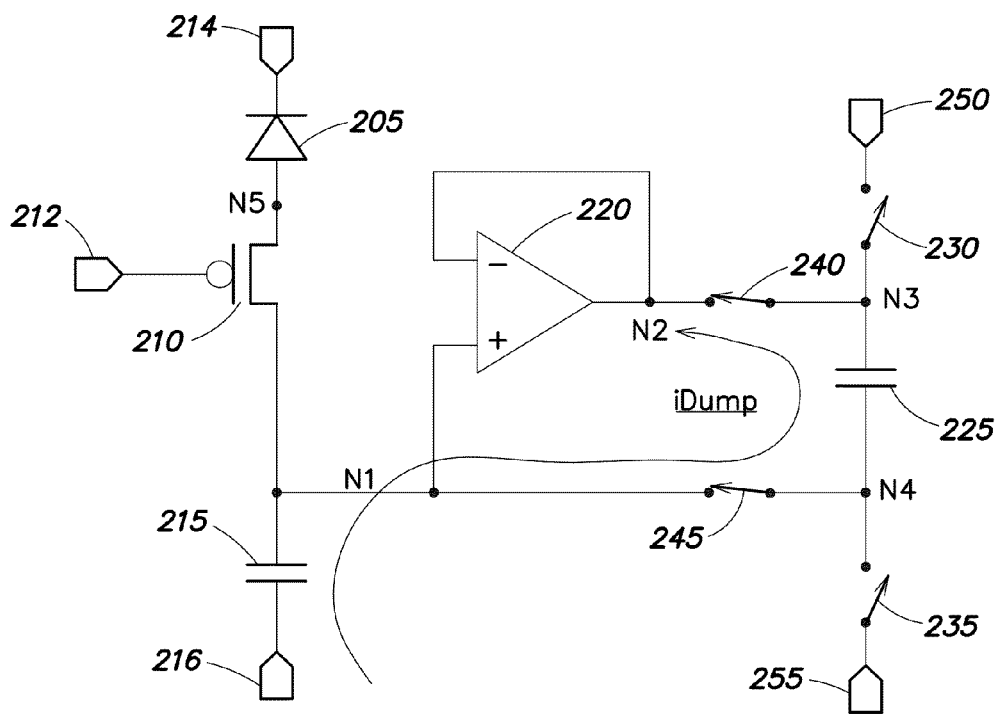
FIG. 4 is a diagram of one example of a precision charge dump circuit in a charge subtraction phase during which the quanta of charge on the programming capacitor are subtracted from the source capacitor, according to aspects of the invention.

FIG. 4 illustrates an example of the charge subtraction phase, Phase 2, during which the programmed quanta of charge on the quanta capacitor 225 are removed from the integration capacitor 215. As discussed above, the switches 230 and 235 are opened for sufficiently long to ensure separation of the charge filling phase from the charge subtraction phase, such that no leakage occurs. The switches 240 and 245 are then closed, as illustrated in FIG. 4, and a discharge current, Idump, flows from the integration capacitor 215, via the quanta capacitor 225, to the operational amplifier 220. When the switches 240 and 245 are closed, node N3 is forced to the same voltage potential as node N1, and that virtual node equivalence is maintained throughout the charge subtraction phase. More specifically, as the voltage on N1 decreases, due to charge subtraction, the voltage on N3 similarly decreases, thereby providing a precision subtraction. In other words, the quanta capacitor 225 is provided with the ability to subtract its equivalent amount of charge from the integration capacitor 215.

As will be appreciated by those skilled in the art, given the benefit of this disclosure, in a ideal circuit the final voltage of the quanta capacitor 225 (at the end of the charge subtraction phase) would be 0.0 volts; however, in practice, this voltage will equate to the differential input offset voltage of the operational amplifier 220. Furthermore, the actual subtracted charge similarly may be affected by the amplifier offset. In one example, an error charge Qe is approximately (Voffset)*(Cs). Methods of calibration of quantizers which may be used to calibrate the quanta of charge to reflect the offset, and calibration of imagers, are well understood in the industry.

Figure 5A:
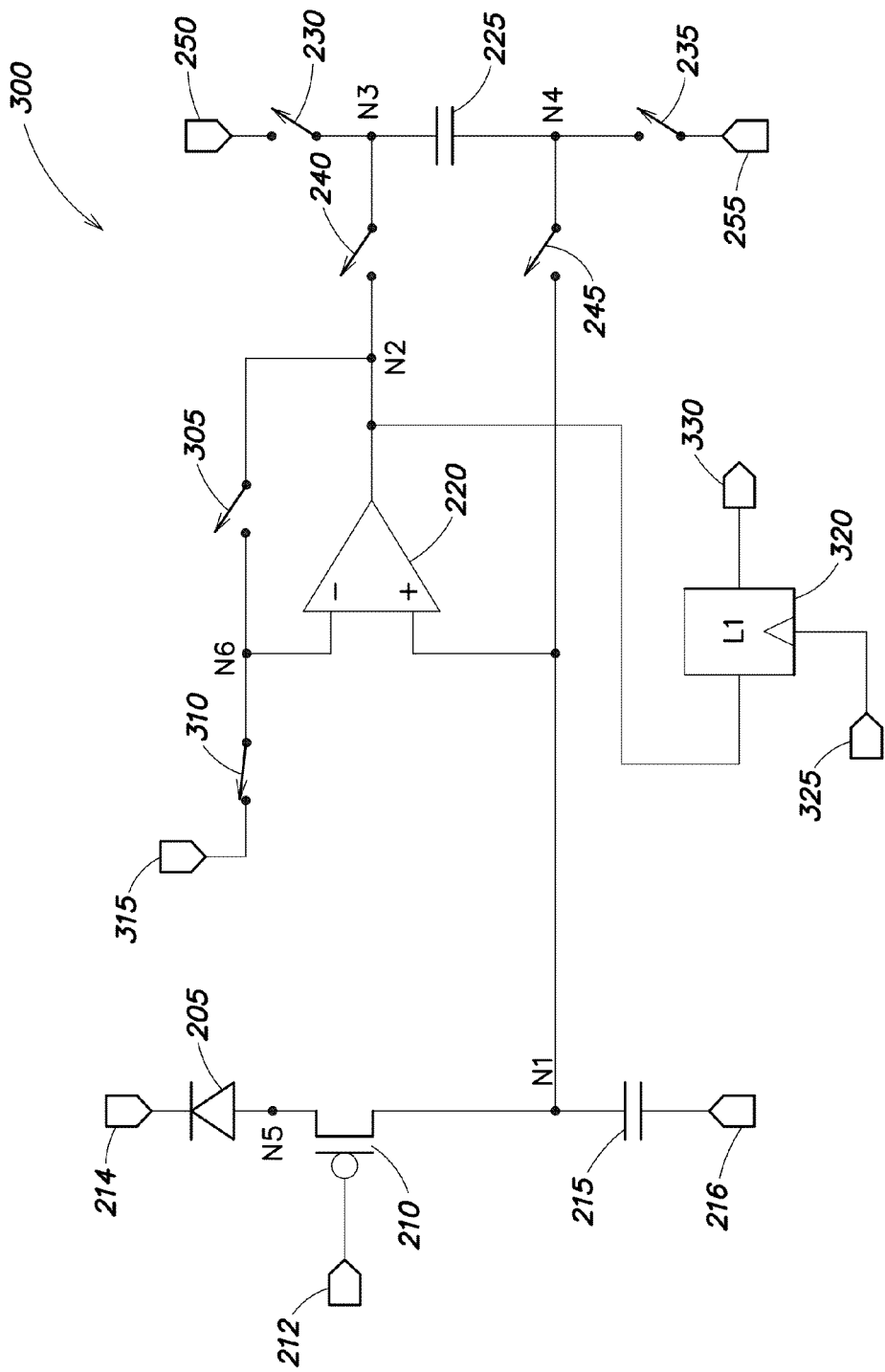
FIG. 5A is a diagram of another example of a precision charge dump circuit having an operational amplifier configured for a threshold compare operation, according to aspects of the invention.

Referring to FIG. 5A, there is illustrated an example of the precision charge dump circuit 300 used in an in-pixel ADC which allows sharing of certain circuitry with other in-pixel ADC functions. In particular, the operational amplifier may be used to do a compare function, as discussed above. For an in-pixel ADC, it is necessary to determine when the integration voltage on node N1 has crossed a threshold. Accordingly, charge dump circuit may be modified, as shown in FIG. 5A, to accommodate additional switches 305 and 310 to the produce a compare capability. According to one embodiment, in the compare operation, the switch 305 is opened to disable the feedback loop (and voltage follower operation) of the operational amplifier 220, and the switch 310 is closed to connect a reference voltage 315 (viRef) to the negative terminal of the operational amplifier (via node N6). As a result, the output of the operational amplifier 220 now becomes a high-gain interpretation of the comparison of the voltage at node N1 and viRef. This high-gain interpretation is effectively a binary value, and may be interpreted loosely as the integration voltage being higher than the reference voltage (viRef). This binary interpretation may be latched in a latch 320 (L1) of the circuit 300. The latch 320 may be operated by applying a clock signal at terminal 325 and a "ready" signal at terminal 330.

Figure 5B:
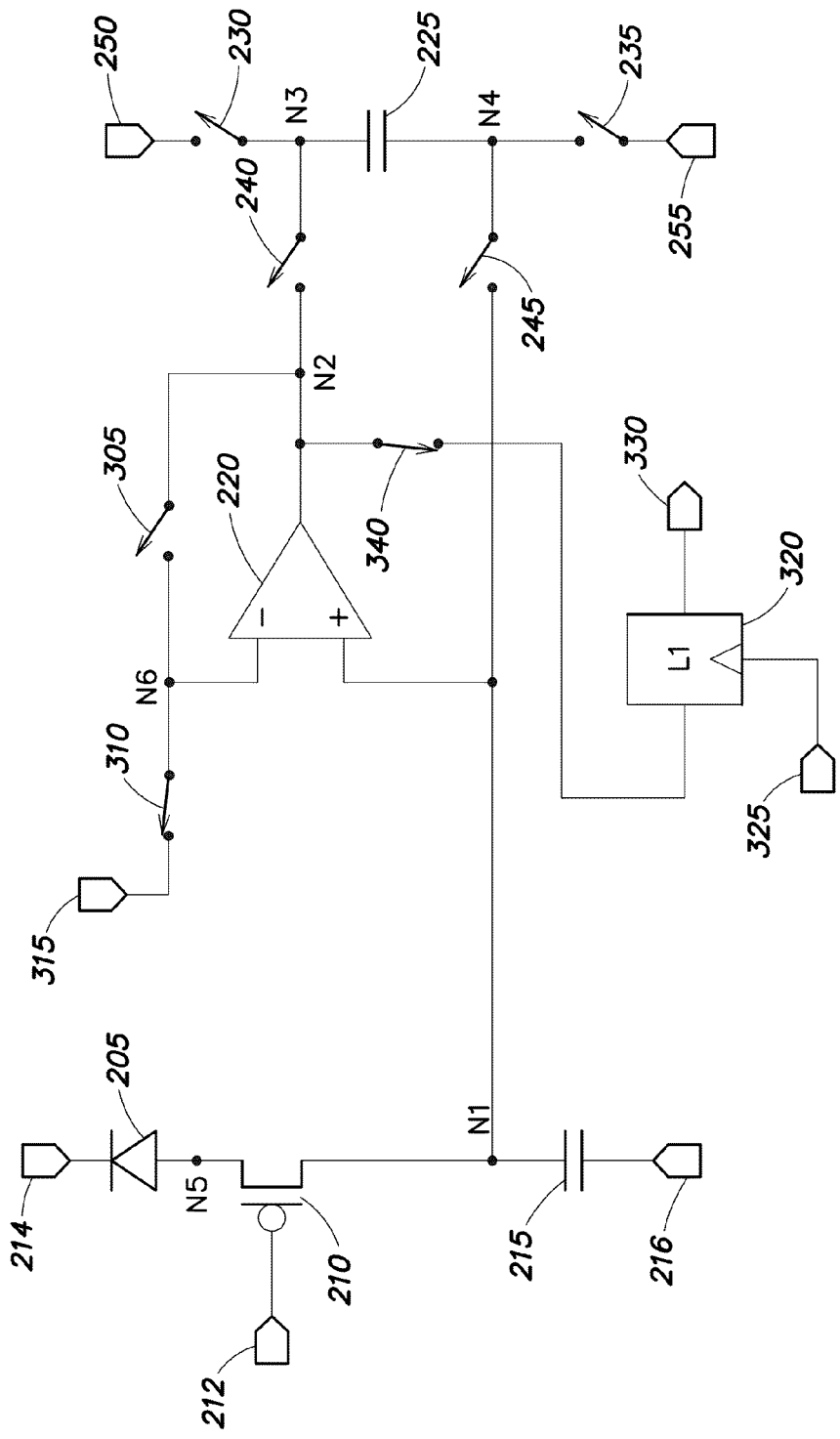
FIG. 5B is a diagram of another example of the precision charge dump circuit having an operational amplifier configured for a threshold compare operation, according to aspects of the invention.

Referring to FIG. 5B, in another embodiment, an optional switch 340 may be inserted between the operational amplifier output and the latch 320 if needed to reduce capacitance variation or clock signal coupling into node N2 during other operations.

Thus, an additional operation, namely the comparison operation, may be added to Phase 1 discussed above.

According to one embodiment, during periodic operation of an in-pixel ADC, particularly in a sampled synchronous imager, a set of clock or enable signals is applied to operate all of the switches 230, 235, 240, 245, 305 and 310. Thus, in one example, the Phase 1 operation of the circuit 300 simultaneously causes a compare operation to determine whether the integrated photo current exceeds a threshold (using the operational amplifier 220) and fills the quanta capacitor 225. In another example, the circuit 300 may be configured (through different application of the clock/enable signals to the switches) to separately perform the filling phase and a compare phase.

According to another embodiment a precision charge dump circuit used in an in-pixel ADC may be extended to perform other functions which may be important to in-pixel ADC operation. For example, a common form of in-pixel ADC counts "buckets" of photo-charge, and those buckets become the binary value of the pixel's photo-current for one frame of operation. However, in some embodiments of in-pixel ADC operation, it may be advantageous to convert the last partially filled bucket of charge to a binary value using an ADC external to the pixel. This may extend the size of the binary value (to more bits); allow the use of a larger-valued integration capacitor 215 and reduced sampling frequency, or any combination of these. In order to support snapshot operation and "integrate while read" (IWR) imager operations, a sample-and-hold capacitor is used.

Figure 6:
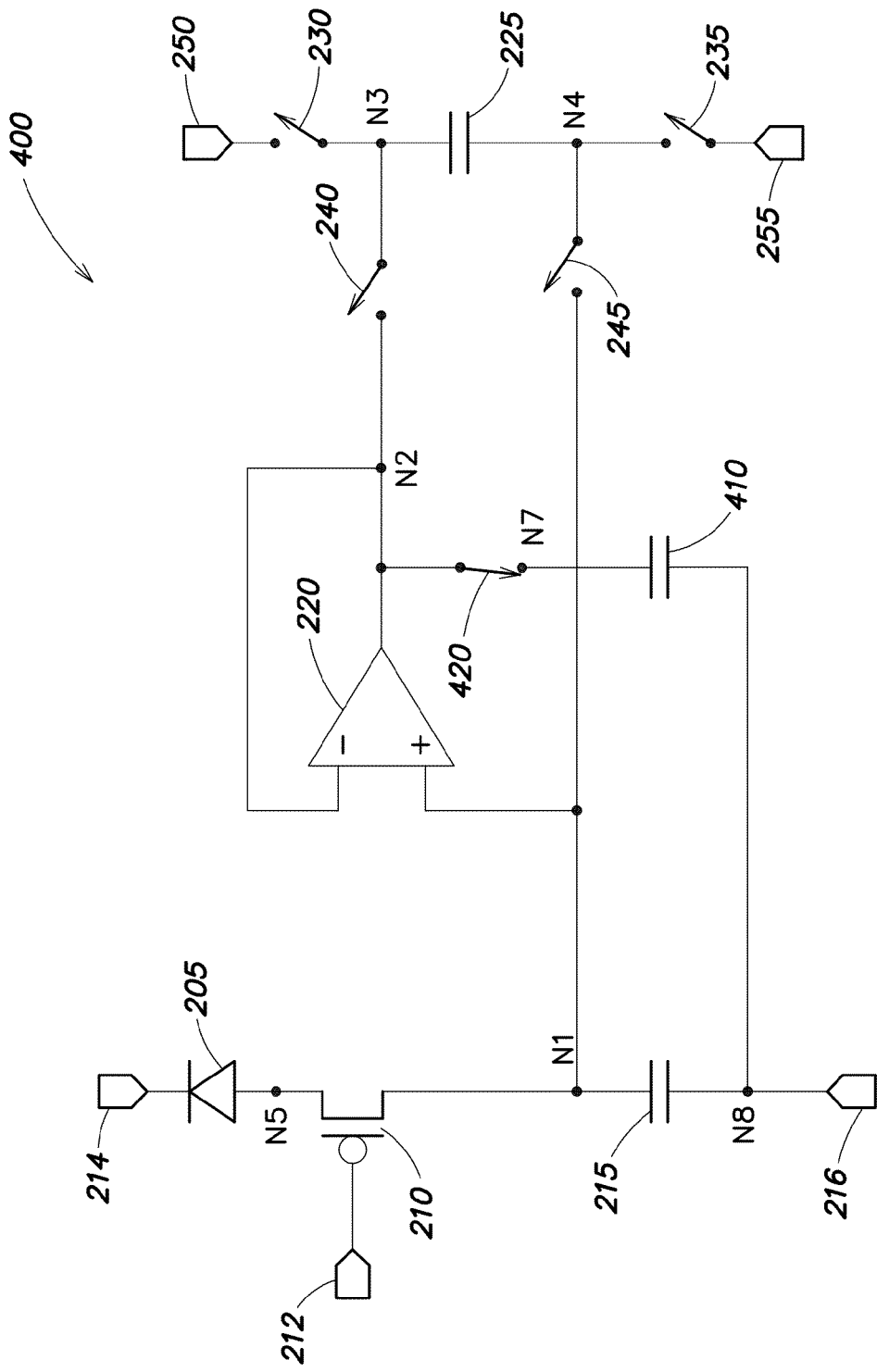
FIG. 6 is a diagram of another example of a precision charge dump circuit having an operational amplifier configured for a sample and hold operation, according to aspects of the invention.

Referring to FIG. 6 there is illustrated an example of a precision charge dump circuit 400 configured to allow the operational amplifier 220 to be additionally used for sample and hold operations. The circuit 400 includes a sample-and-hold capacitor 410 coupled between a switch 420 (at node N7) and one terminal of the integration capacitor 215 (at node N8 between the integration capacitor 215 and the low voltage reference terminal 216). With the use of the sample-and-hold capacitor 410, at the end of a frame, the lingering (residual) voltage on the integration capacitor 215 may be transferred to the sample-and-hold capacitor 410. The operational amplifier 220 may be reused for this operation. In this example, the operation of circuit 400 includes an additional phase, Phase 4, which is the sample-and-hold transfer phase. As illustrated in FIG. 6, to transfer the residual charge from the integration capacitor 215 to the sample-and-hold capacitor 410, the switch 420 is closed to couple node N7 to the output of the operational amplifier 220 (node N2). Switches 230, 235, 240 and 245 are open in this phase.

Thus, aspects and embodiments provide a charge dump circuit which may precisely subtract quanta of charge from an integration capacitor while the capacitor is simultaneously integrating photo-current, and thereby provide several advantages. For example, this may provide improved accuracy, particularly for synchronously sampled quantizer circuits, relative to conventional methods which simply reset the integration capacitor. Simultaneous integration and charge subtraction may allow close to 100% charge integration, which may be highly advantageous. The amount of charge to be subtracted, or added, as discussed further below, may be set using voltage references and the quanta capacitor, as described above, and therefore may be independent of the source (e.g., integration) capacitor. In addition, as discussed above, the configuration in which the integration capacitor is included in the charge dump circuit allows the circuit to share the operational amplifier with other circuit functions that are a part of an in-pixel ADC. The size of the quanta capacitor 225 may be programmable, and the voltages of the voltage references 250 and/or 255 may be varied to allow great flexibility in the values of the charge quanta (Qs) that may be added to or subtracted from the integration capacitor 215.

As discussed above, various embodiments of the precision charge dump circuit may operate to subtract precise quanta of charge from the source (e.g., integration) capacitor 215. According to another embodiment, the terminals of the quanta capacitor 225 may be reversed to add, instead of subtract, the precise quanta of charge to the integration capacitor 215. The charge add function may be useful, for example, in in-pixel ADC circuits where the detector is negatively (instead of positively) biased.

The function and advantages of these and other embodiments will be more fully understood from the following examples. The examples are intended to be illustrative in nature and are not to be considered as limiting the scope of the systems and methods discussed herein.

EXAMPLES

Figure 7:
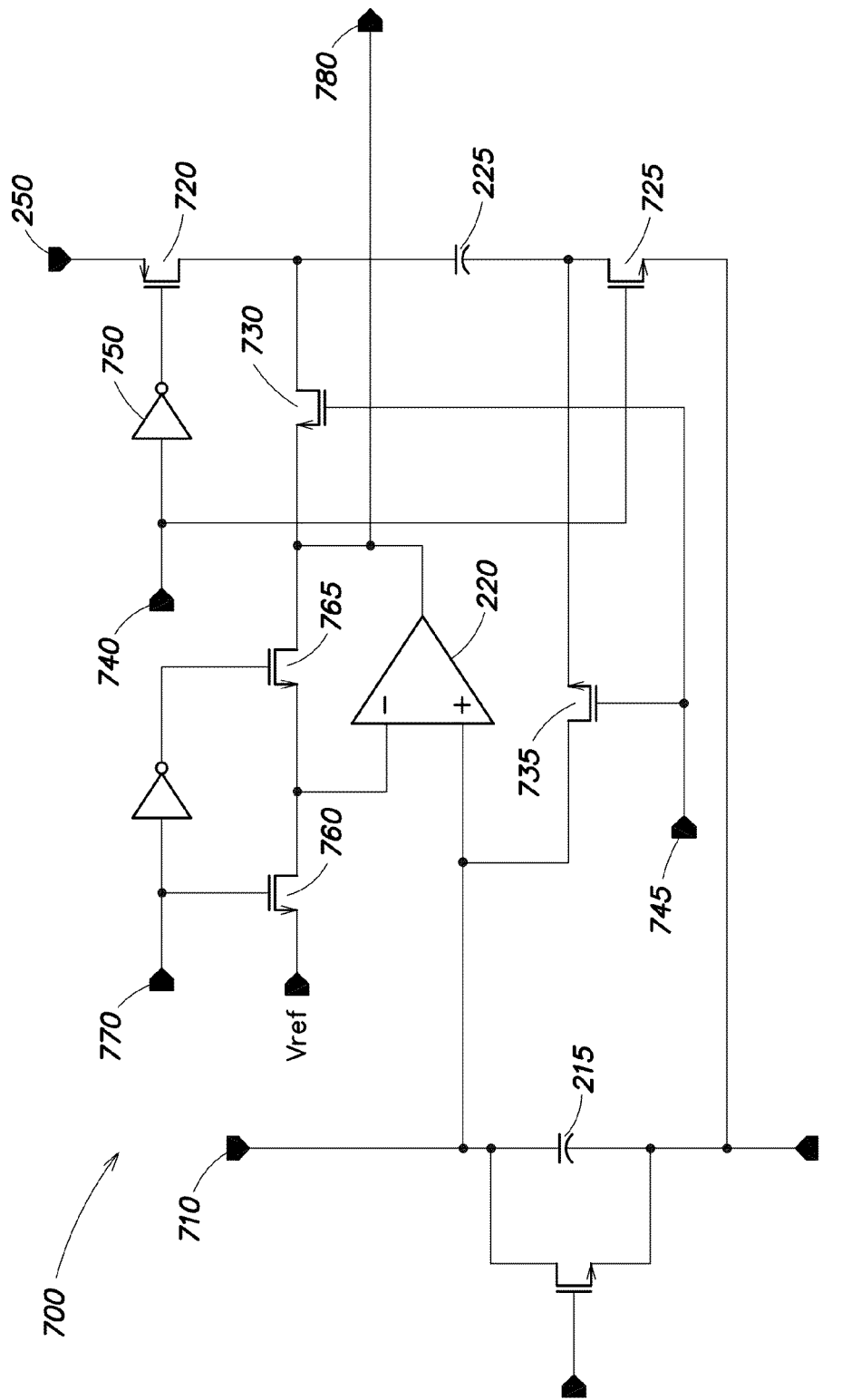
FIG. 7 is a schematic diagram of an example of a precision charge dump circuit used in a simulation, according to aspects of the invention.

An example of a precision charge pump circuit according to one embodiment was simulated using SPICE (Simulation Program with Integrated Circuit Emphasis), a general-purpose, open source analog electronic circuit simulator. The schematic diagram of the simulated circuit is illustrated in FIG. 7. In the simulated example, the direct injection (DI) gate transistor 210 was removed and replaced with a current source 710 set to 1 nano-Ampere (nA). The integration capacitor 215 was set to 100 femtoFarads (fF), and the quanta capacitor 225 was set to 30 fF. The switches 230, 235, 240 and 245 discussed above were implemented using FETs 720, 725, 730 an 735, respectively.

To conduct the simulation, periodically, every 75 microseconds (µs), an 80 nanosecond (ns) pulse was applied via control terminals 740 and 745 to cause the circuit to transition from the charge filling phase to the charge subtraction phase. In the simulated example, the control pulse was separated into a "charge" control signal applied at terminal 740 and a "subtraction" control signal applied at terminal 745. This may be achieved, for example, by separating the pulse into two paths, and delaying and inverting one path relative to the other. This creates the phase separation (Phase 2 discussed above) such that the charge filling switches 720 and 725 are not on (or closed) at the same time as the charge subtraction switches 730, 735. This type of operation may be referred to as "make before break." Thus, in the charge-filling phase the charge control signal applied at terminal 740 causes switches 720 and 735 to close to allow the charging current to flow to the quanta capacitor 225 (as discussed above with respect to FIG. 4). In the illustrated example, the FETs 720 and 725 are of opposite type and therefore an inverter 750 is used to change the sign of the control signal from terminal 740 applied to the FET 720. In the charge-subtraction phase, the subtraction control signal applied at terminal 745 causes the switches 730 and 730 to close, as discussed above with reference to FIG. 5.

For this simulated example, the simulated circuit 700 assumed 180 nm CMOS construction of the components, and the applied supply voltages were uniformly 1.8 V. The reference voltage for the quanta capacitor 225 was tied to the supply, and therefore was also 1.8 V.

Also in the simulated example, as shown in FIG. 7, a compare operation of the operational amplifier 220 was implemented using a reference voltage, Vref, applied to the negative terminal of the amplifier 220 and a pair of FET switches 760, 765. A "compare" control signal applied at terminal 770 controls the FETs 760, 756 to enable a "compare" output from the operational amplifier 220 at terminal 780 during a compare operation.

Figure 8:
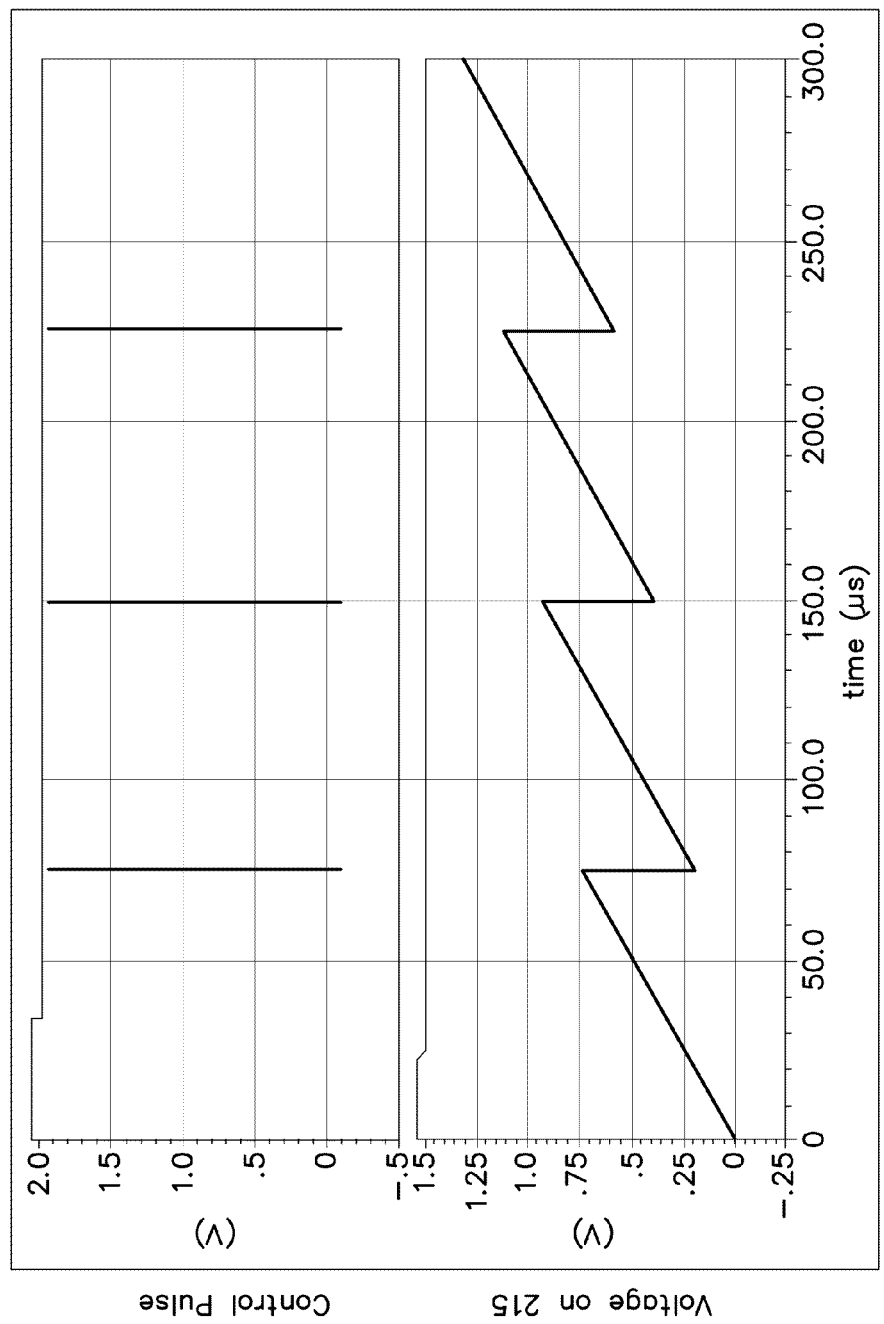
FIG. 8 is a graph illustrating voltage waveforms from the simulation of the circuit of FIG. 7.

FIG. 8 illustrates simulation results from the circuit 700, confirming operation of the circuit. In FIG. 8, the upper waveform is a series of 80 ns pulses applied via terminal 745 to the NFETs 730, 735 functioning as switches 240 and 245. The lower panel illustrates the voltage waveform on the integration capacitor 125. At each pulse, the voltage on the integration capacitor 215 drops by about 0.54 volts.

Table 1 below illustrates a number of values corresponding to various calculations. First, the theoretical step voltage caused by removing a quantum of charge is calculated. For this calculation, Cs is the capacitance of the quanta capacitor 225, namely 30 fF, Vr is the applied reference voltage (1.8 V), and Cint is the capacitance of the integration capacitor 215, namely 100 fF. Qs is the quantum of charge and is equal to Cs*Vr. From these values, the step voltage, Vs is calculated to be 540 mV. As discussed above, according to certain embodiments, the charge dump circuit 700 continues to integrate photo-current during the charge subtraction phase. Accordingly, the amount of voltage added to the integration capacitor during the 80 nS subtraction phase is also calculated. For an 80 nS pulse (Pw), with a detector current (Idet) of 1 nA, an additional charge Qw of 80e-18 Coulombs of charge will be added to the 100 fF Cint, yielding an incremental 800 μV (Vw) on the integration capacitor 215. Consequently, when measuring the voltage difference, Vdiff, of the voltage step on the integration capacitor 215, 800 μV is added back in to account for voltage accumulated during the subtraction phase.

TABLE 1

| Calculation of Step Voltage (Vs) | | | Calculation of Integration Voltage (Vi) during Charge Subtraction | | |
|---|---|---|---|---|---|
| Cs (225) | 30 | fF | Pw | 80 | ns |
| Vref | 1.8 | V | Idet | 1 | nA |
| Qs | 54 | fC | Qw | 80.0E−18 | C |
| Cint (215) | 100 | fF | Cint (215) | 100 | fF |
| Vs (calc.) | 0.543 | V | Vw | 800 | μV |

| Error Measurement/Calculation From Using Waveform Minima | | | | | | |
|---|---|---|---|---|---|---|
| V1 | V2 | Vdiff | Vw | Vs | Vs (calc) | Error % |
| 0.7387 | 0.1996 | 0.5391 | 800.0E−6 | 539.9E−3 | 540.0E−3 | 0.019 |
| 0.9389 | 0.3968 | 0.5421 | 800.0E−6 | 542.9E−3 | 540.0E−3 | −0.537 |
| 1.135 | 0.5935 | 0.5415 | 800.0E−6 | 542.3E−3 | 540.0E−3 | −0.426 |

| Error Measurement/Calculation From Using Pulse Edges | | | | | | |
|---|---|---|---|---|---|---|
| V1 | V2 | Vdiff | Vw | Vs | Vs (calc) | Error % |
| 0.7387 | 0.2035 | 0.5352 | 800.0E−6 | 536.0E−3 | 540.0E−3 | 0.741 |
| 0.9389 | 0.401 | 0.5379 | 800.0E−6 | 538.7E−3 | 540.0E−3 | 0.241 |
| 1.135 | 0.5979 | 0.5371 | 800.0E−6 | 537.9E−3 | 540.0E−3 | 0.389 |

In Table 1, the error between the ideal 540 mV step voltage (Vs) and the measured or calculated step voltages was determined using two different methods. In the upper measurements, the step waveform minima were used, and in the lower measurements the back-edge of the 730/735 switch enabling pulse (applied at terminal 745) was used. V Each calculation was performed three times. As can be seen with reference to Table 1, in both cases, the error between the ideal value and the measured value was less than +/−1%. This error may result from the replacement of ideal switches 230, 235, 240 and 245 with the MOSFET switches 720, 725, 730 and 735, which have non-negligible gate capacitance to virtual supply and non-negligible ON resistance. These stray capacitances affect both the integration capacitor 215 and the quanta capacitor 225, and the ON resistance causes a non-trivial settling time. However, as noted above, the simulated charge subtraction was accurate to within 1% over a wide voltage range. Since the operational amplifier 220 will also have an offset, the step voltage error may be combined with the amplifier offset into a uniformity correction term, as will be understood by those skilled in the art, given the benefit of this disclosure.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A precision charge dump circuit comprising:

an amplifier having a first input, a second input, and an output, and configured in a voltage-follower configuration with the output coupled to the first input;

a first capacitor coupled to the second input terminal of the amplifier;

a second capacitor coupled between first and second voltage references by a first pair of switches operable to selectively allow the second capacitor to be charged with a predetermined quantum of charge from the first voltage reference, the second capacitor being connected between the first pair of switches; and a second pair of switches including a first switch connected between the first capacitor and a first terminal of the second capacitor, and a second switch connected between an output of the amplifier and a second terminal of the second capacitor, the second pair of switches operable to selectively transfer the predetermined quantum of charge to or from the first capacitor.

2. The precision charge dump circuit of claim 1, wherein the first capacitor is an integration capacitor coupled to a photo-detector and configured to integrate photo-current from the photo-detector.

3. The precision charge dump circuit of claim 1, wherein the first terminal of the second capacitor is a negative terminal, the second terminal of the second capacitor is a positive terminal, and the second pair of switches is operable to selectively subtract the predetermined quantum of charge from the first capacitor.

4. The precision charge dump circuit of claim 1, wherein the first terminal of the second capacitor is a positive terminal, the second terminal of the second capacitor is a negative terminal, and the second pair of switches is operable to selectively add the predetermined quantum of charge to the first capacitor.

5. The precision charge dump circuit of claim 1, wherein the first pair of switches and the second pair of switches are configured such that the switches of the second pair of switches are not closed at the same time that the switches of first pair of switches are closed.

6. The precision charge dump circuit of claim 1, wherein the amplifier is an operational amplifier.

7. The precision charge dump circuit of claim 6, wherein the operational amplifier is configured to perform a compare operation, and further comprising a third pair of switches configured to selectively interrupt the voltage follow configuration of the operational amplifier and couple a third voltage reference to the first terminal of the operational amplifier.

8. The precision charge dump circuit of claim 7, further comprising a latch coupled to the output of the operational amplifier.

9. The precision charge dump circuit of claim 6, wherein the first terminal of the second capacitor is coupled to a first terminal of the first capacitor and the operational amplifier is configured to perform a sample-and-hold operation, and further comprising:
   a third capacitor having a first terminal coupled to the second terminal of the first capacitor; and
   an additional switch connected between the output of the operational amplifier and a second terminal of the third capacitor and operable to selectively connect the output of the operational amplifier to the second terminal of the third capacitor.

10. The precision charge dump circuit of claim 1, wherein the first and second pairs of switches include FET switches.

11. A method of subtracting predetermined quanta of charge from a source capacitor, the method comprising:
   pre-charging a programming capacitor with a predetermined quantum of charge; and
   subsequently subtracting the predetermined quantum of charge from the source capacitor by coupling the programming capacitor between the source capacitor and an output of an amplifier configured in a voltage follower configuration.

12. The method of claim 11, wherein pre-charging the programming capacitor includes connecting the programming capacitor between a pair of voltage references.

13. The method of claim 12, wherein connecting the programming capacitor between a pair of voltage references includes closing a first switch to connect a first terminal of the programming capacitor to a first voltage reference of the pair, and closing a second switch to connect a second terminal of the programming capacitor to a second voltage reference of the pair.

14. The method of claim 13, wherein coupling the programming capacitor between the source capacitor and the output of an amplifier includes opening the first and second switches, and closing a third switch to connect the first terminal of the programming capacitor to the output of the amplifier, and closing a fourth switch to connect the second terminal of the programming capacitor to the source capacitor.

15. The method of claim 11, further comprising integrating photo-current from a photo-detector with the source capacitor simultaneously with the subtracting of the predetermined quantum of charge from the source capacitor.

16. The method of claim 11, wherein the amplifier is an operational amplifier, and further comprising performing a compare operation using the amplifier by selectively coupling a voltage reference to an input terminal of the operational amplifier.

17. The method of claim 11, wherein the amplifier is an operational amplifier, and further comprising performing a sample-and-hold operation with the operational amplifier by selectively coupling a third capacitor between a voltage reference and the output of the operational amplifier.

18. A method of adding predetermined quanta of charge to a first capacitor, the method comprising:
   pre-charging a second capacitor with a predetermined quantum of charge; and
   subsequently adding the predetermined quantum of charge to the second capacitor by coupling the second capacitor between the first capacitor and an output of an amplifier configured in a voltage follower configuration.

* * * * *